United States Patent
Toda et al.

[11] Patent Number: 5,982,204
[45] Date of Patent: Nov. 9, 1999

[54] INFORMATION-DISCRIMINATING CIRCUIT

[75] Inventors: Akihiko Toda; Masao Noro, both of Hamamatsu, Japan

[73] Assignee: Yamaha Corporation, Hamamatsu, Japan

[21] Appl. No.: 08/989,572

[22] Filed: Dec. 12, 1997

[30] Foreign Application Priority Data

Dec. 16, 1996 [JP] Japan .................................... 8-336064

[51] Int. Cl.[6] ........................................................ H03K 5/22

[52] U.S. Cl. .............................. 327/86; 327/77; 327/307

[58] Field of Search .................................. 327/72, 73, 74, 327/77, 87, 88, 89, 307, 362, 363, 560–563

[56] References Cited

U.S. PATENT DOCUMENTS

| | | | |
|---|---|---|---|
| 4,602,169 | 7/1986 | Shimizu | 327/73 |
| 5,666,075 | 9/1997 | Schinzel | 327/77 |
| 5,821,790 | 10/1998 | Sweetman | 327/72 |
| 5,844,439 | 12/1998 | Zortea | 327/307 |

*Primary Examiner*—Toan Tran
*Attorney, Agent, or Firm*—Graham & James

[57] ABSTRACT

An information-discriminating circuit has a biasing device that superposes bias voltage on an input signal, and a comparator that discriminates information by comparing an output signal from the biasing device with a threshold value. The difference between the bias voltage and the threshold value is continuously adjusted such that a noise margin is varied according to the amplitude of the input signal.

7 Claims, 4 Drawing Sheets

FIG.1
PRIOR ART
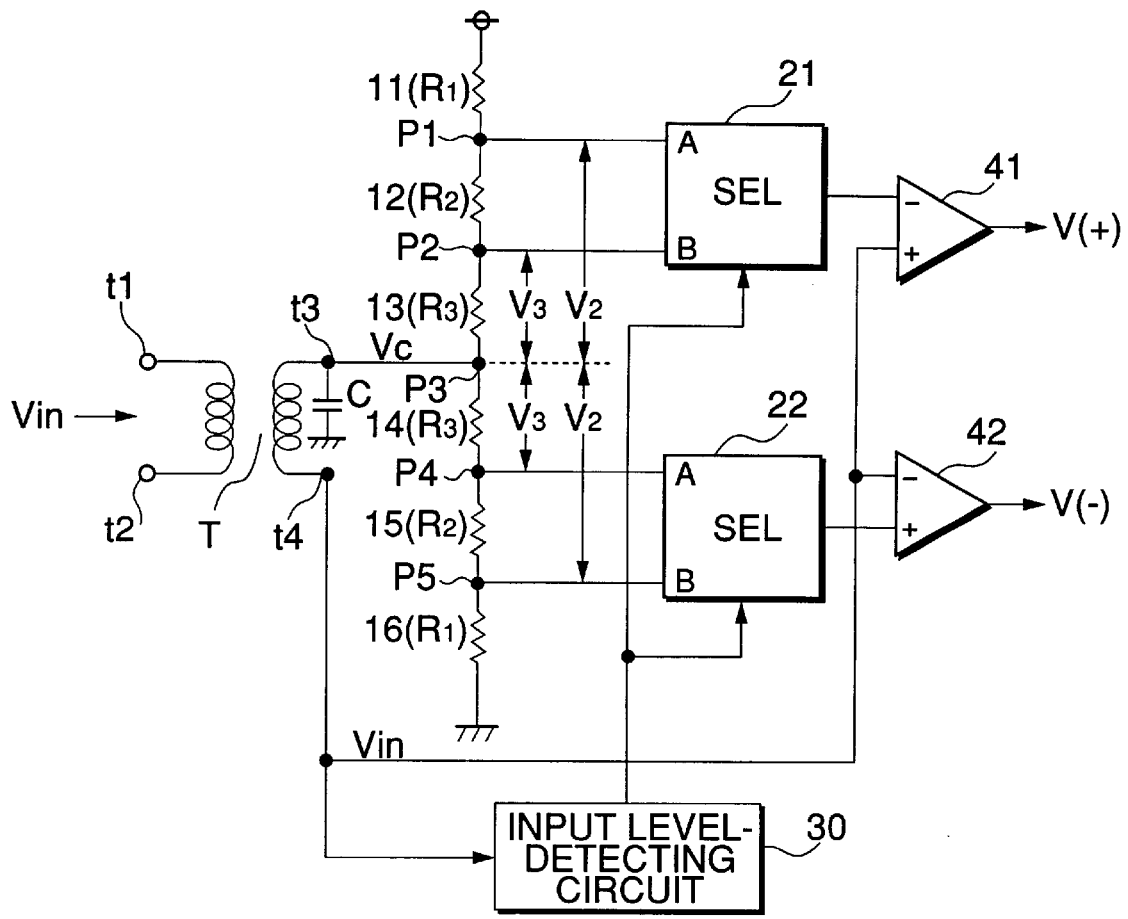
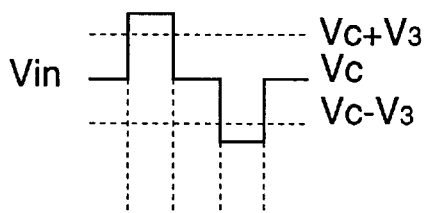
FIG.2A PRIOR ART
FIG.2B PRIOR ART
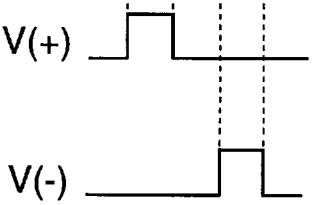
FIG.2C PRIOR ART

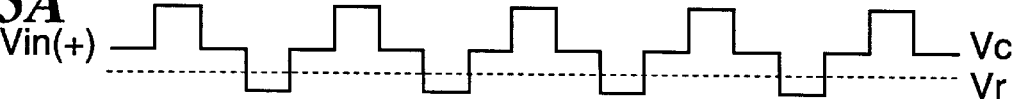
FIG.5A Vin(+)
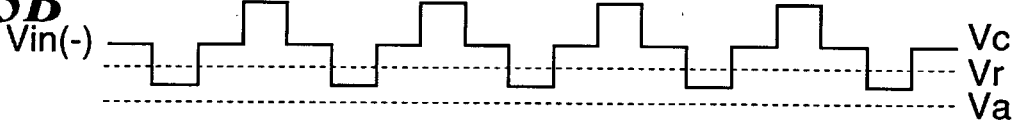
FIG.5B Vin(-)
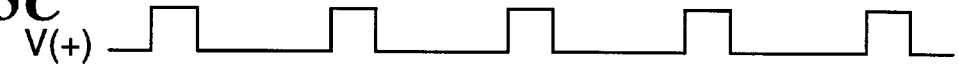
FIG.5C V(+)
FIG.5D V(-)
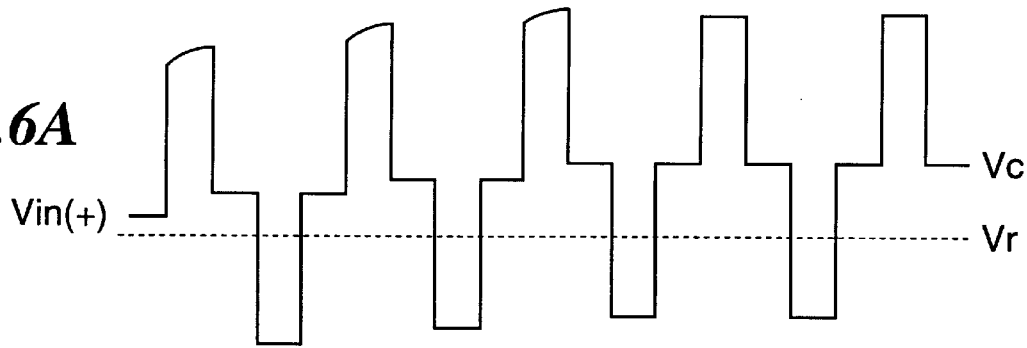
FIG.6A Vin(+)
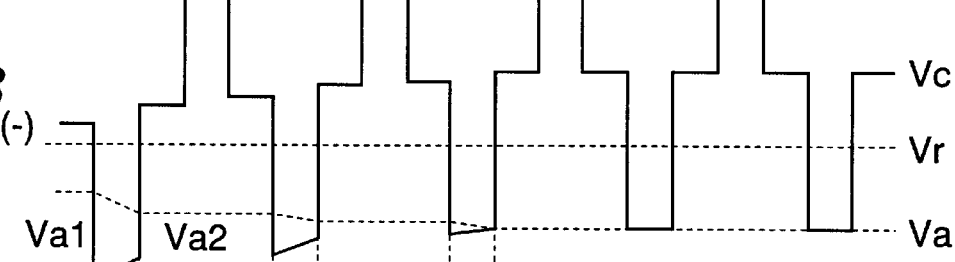
FIG.6B Vin(-)
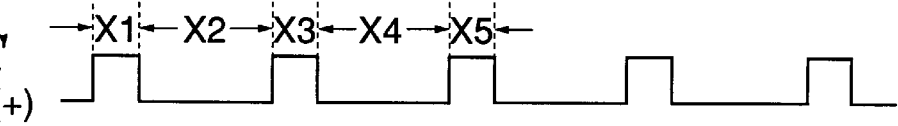
FIG.6C V(+)
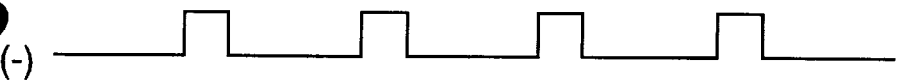
FIG.6D V(-)

INFORMATION-DISCRIMINATING CIRCUIT

BACKGROUND OF THE INVENTION

1. Field of the Invention

This invention relates to an information-discriminating circuit which is suitable for use as an interface of ISDN (Integrated Services Digital Network).

2. Prior Art

As information-oriented society has advanced in these days, it is demanded to transmit a large amount of information. ISDN is provided to meet such demand, and the residence of a subscriber thereof is normally provided with two 64-kbps channels and a 16-kbps channel. In such a case, information is transmitted in the form of a ternary signal over telecommunication lines such as a telephone line. Therefore, a receiving side, such as facsimile terminal equipment and a MODEM, has to be equipped with an information-discriminating circuit for discriminating information in the ternary signal transmitted thereto.

The ternary signal supplied to the receiving side is transmitted through various transmission lines, such as a telephone line, relay stations, and terminal equipment, and therefore the signal input to the receiving side varies in amplitude depending on characteristics of the transmission lines. If the input signal thus varying in amplitude is compared with a fixed threshold value to discriminate information in the signal, a sufficient noise margin cannot be obtained, to thereby increase the bit error rate. To overcome this inconvenience, the conventional information-discriminating circuit changes the threshold value according to the amplitude of the input signal.

The conventional information-discriminating circuit will now be described hereinbelow with reference to FIGS. 1 to 3.

FIG. 1 shows the circuit arrangement of the conventional information-discriminating circuit. In the figure, a transformer T has an output terminal t3 on a secondary side thereof, which is connected to a junction P3 between resistances 13 and 14. Resistances 11, 12, 15, and 16, and the resistances 13 and 14 are serially connected between a power supply and ground, to divide supply voltage. The values of the resistances 11 to 16 are set so as to be symmetrical with respect to the junction P3 between the resistances 13 and 14. More specifically, the values of the resistances 11 and 16 are set to a value R1, the values of the resistances 12 and 15 to a value R2, and the values of the resistances 13 and 14 to a value R3, respectively. A capacitor C is connected between the output terminal t3 and ground and functions as a bypass capacitor for eliminating an AC component of a signal input thereto to stabilize the voltage. A selector 21 has input terminals A and B thereof connected to junctions P1 and P2 of the resistances 11, 12 and 13, and a selector 21 has input terminals A and B to junctions P4 and P5 of the resistances 14, 15 and 16, respectively. In the illustrated example, voltage at the input terminal A of the selector 21 is equal to Vc+V2, and voltage at the input terminal A of the selector 22 is equal to Vc−V2. On the other hand, voltage at the input terminal B of the selector 21 is equal to Vc+V3, and voltage at the input terminal B of the selector 22 is equal to Vc−V3.

When an input signal Vin is supplied to input terminals t1 and t2 of the transformer T, a DC component of the input signal Vin is eliminated by the transformer T, and the resulting input signal Vin is supplied from an output terminal t4 of the transformer T to an input level-detecting circuit 30.

The input level-detecting circuit 30 detects the amplitude of the input signal Vin (hereinafter referred to as "the input level"), and compares the detected amplitude with a predetermined value, to thereby generate a control signal which controls the selectors 21 and 22. In the illustrated example, when the input level exceeds the predetermined value, the voltage at the input terminal A of the selector 21 or 22 is selected, whereas when the input level is below the predetermined value, the voltage at the input terminal B of the selector 21 or 22 is selected. Further, output voltage from the selector 21 is applied to a negative input terminal of a comparator 41, and output voltage from the selector 22 to a positive input terminal of a comparator 42, respectively, the both output voltage values being used as threshold values for discriminating information in the input signal Vin.

Next, description will be made of how the conventional information-discriminating circuit operates when the input level is so low that it is below the predetermined value, with reference to a timing chart of FIGS. 2A to 2C. FIG. 2A shows a waveform of the input signal Vin supplied to the comparators 41 and 42, which fluctuates with respect to the voltage Vc as a central value. In this case, the threshold values of the comparators 41 and 42 are set to Vc+V3 and Vc−V3, respectively. As a result, the comparators 41 and 42 generate output voltages V(+) and V(−) as shown in FIGS. 2B and 2C, respectively.

Further, description will be made of how the circuit operates when the input level is so high that it exceeds the predetermined value, with reference to a timing chart of FIGS. 3A to 3C. FIG. 3A shows a waveform of the input signal Vin supplied to the comparators 41 and 42, which fluctuates with respect to the voltage or central value Vc. In this case, the threshold values of the comparators 41 and 42 are set to Vc+V2 and Vc−V2, respectively. As a result, the comparators 41 and 42 generate output voltages V(+) and V(−) as shown in FIGS. 3B and 3C, respectively.

As described above, the conventional information-discriminating circuit stepwise changes the threshold values according to the input level to increase the noise margin.

In the conventional information-discriminating circuit, the threshold values of the comparators 41 and 42 are set by the use of the resistances 11 to 16. Therefore, the threshold values can be only stepwise set even if the number of the resistances is increased. Thus, the conventional information-discriminating circuit has the disadvantage that the maximum noise margin cannot be always obtained.

To increase the noise margin, the number of threshold values needs to be increased. If the number of threshold values is increased, however, the process of generating the control signal by the input level-detecting circuit 30 becomes complicated, and further the number of input terminals of the selectors 21 and 22 must be increased, which unfavorably increases the number of component parts of the information-discriminating circuit.

SUMMARY OF THE INVENTION

It is the object of the invention to provide an information-discriminating circuit which is capable of always obtaining a maximum noise margin according to the input level with a simple construction.

To attain the above object, the present invention provides an information-discriminating circuit comprising a biasing device that superposes bias voltage on an input signal, a comparator that discriminates information by comparing an output signal from the biasing device with a threshold value, and a controller that continuously adjusts a difference between the bias voltage and the threshold value such that a noise margin is varied according to amplitude of the input signal.

In a preferred form of the invention, the threshold value is a fixed value, and the controller continuously varies the bias voltage, based on the threshold value and the amplitude of the input signal.

Preferably, the controller comprises a peak-hold circuit that detects a peak level of the output signal from the biasing device and holds the peak level with a shorter time constant upon rise of the peak level and with a longer time constant upon fall of the peak level, and a control circuit that continuously varies the bias voltage according to a difference between the peak level held by the peak-hold circuit and the threshold value.

More preferably, the peak-hold circuit holds the peak level of the output signal from the biasing device when the peak level exceeds a predetermined value.

Further preferably, the threshold value is set to a middle value between the bias voltage and the peak level held by the peak-hold circuit.

In an alternative form of the invention, the controller continuously varies the threshold value, based on the bias voltage and the amplitude of the input signal.

Advantageously, the controller controls the bias voltage to a constant value when the amplitude of the input signal is smaller than a predetermined value, and continuously adjusts the difference between the bias voltage and the threshold value such that the noise margin becomes larger when the amplitude of the input signal is larger than the predetermined value.

In a preferred embodiment of the invention, there is provided an information-discriminating circuit for discriminating information from an input signal in a form of a ternary signal, comprising an input transformer having a primary side thereof supplied with the input signal, and a secondary side thereof having a pair of output terminals and an intermediate terminal, a biasing device that supplies bias voltage to the intermediate terminal of the input transformer, a first comparator circuit that discriminates the information by comparing a first output signal from one of the output terminals of the input transformer with a threshold value, a second comparator circuit that discriminates the information by comparing a second output signal from another one of the output terminals of the input transformer with the threshold value, the second output signal being inverted relative to the first output signal, a peak-hold circuit that detects a peak level of one of the first and second output signals and holds the peak level with a shorter time constant upon rise of the peak level and with a longer time constant upon fall of the peak level, and a control circuit that controls the bias voltage according to a difference between the peak level held by the peak-hold circuit and the threshold value.

The above and other objects, features, and advantages of the invention will be more apparent from the following detailed description taken in conjunction with the accompanying drawings.

BRIEF DESCRIPTION OF THE DRAWINGS

FIG. 1 is a circuit diagram showing the circuit arrangement of a conventional information-discriminating circuit;

FIGS. 2A to 2C collectively form a timing chart useful in explaining the relationship between an input signal Vin and output voltages V(+) and V(−) in the case where the input level is low, in which:

FIG. 2A shows a change in the input signal Vin;

FIG. 2B shows a change in the output voltage V(+); and

FIG. 2C shows a change in the output voltage V(−);

FIGS. 3A to 3C collectively form a timing chart useful in explaining the relationship between the input signal Vin and the output voltages V(+) and V(−) in the case where the input level is high, in which:

FIG. 3A shows a change in the input signal Vin;

FIG. 3B shows a change in the output voltage V(+); and

FIG. 3C shows a change in the output voltage V(−);

FIGS. 5A to 5D collectively form a timing chart useful in explaining the relationship between input voltages Vin(+) and Vin(−) of an input signal Vin, and output voltages V(+) and V(−) in the case where the input level is low, in which:

FIG. 5A shows a change in the input voltage Vin(+);

FIG. 5B shows a change in the input voltage Vin(−);

FIG. 5C shows a change in the output voltage V(+); and

FIG. 5D shows a change in the output voltage V(−); and

FIGS. 6A to 6D collectively form a timing chart useful in explaining the relationship between the input voltages Vin(+) and Vin(−) and the output voltages V(+) and V(−) in the case where the input level is high, in which:

FIG. 6A shows a change in the input voltage Vin(+);

FIG. 6B shows a change in the input voltage Vin(−);

FIG. 6C shows a change in the output voltage V(+); and

FIG. 6D shows a change in the output voltage V(−).

DETAILED DESCRIPTION

The invention will now be described in detail with reference to the drawings showing an embodiment thereof.

Figures 3A, 3B, 3C:
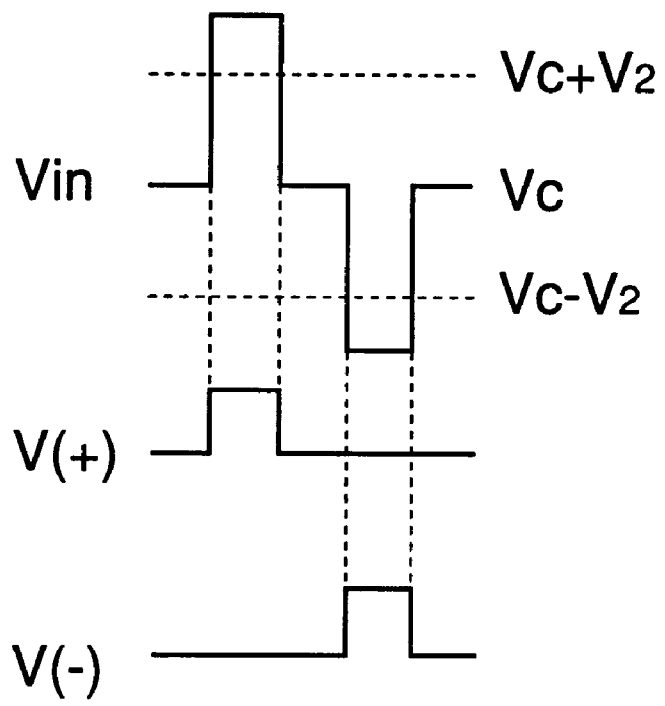
Figure 4:
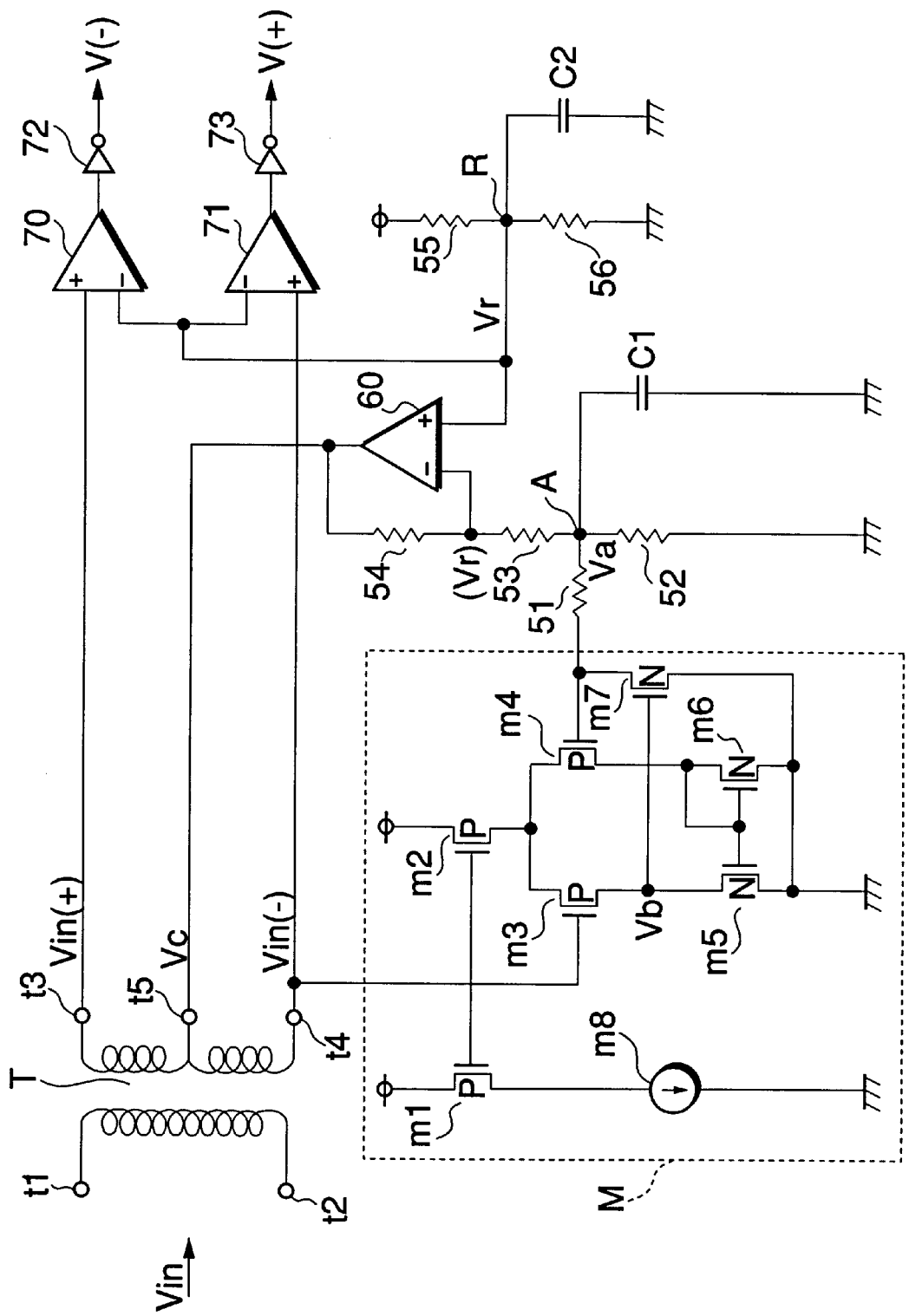
FIG. 4 is a circuit diagram showing the circuit arrangement of an information-discriminating circuit according to an embodiment of the invention.

Referring first to FIG. 4, there is illustrated the circuit arrangement of an information-discriminating circuit according to an embodiment of the invention. In the figure, symbol T designates a transformer which has input terminals t1 and t2 on a primary side thereof and output terminals t3 and t4 and an intermediate terminal t5 on a secondary side thereof. The position of the intermediate terminal t5 is set such that K1:K2=1:1 holds, where K1 represents the number of turns between the output terminal t3 and the intermediate terminal t5, and K2 the number of turns between the output terminal t4 and the intermediate terminal t5. The transformer T functions to eliminate common mode noise. Symbol M designates a control circuit which controls voltage Va according to the input level, i.e. the amplitude of a signal Vin input to the input terminals t1 and t2 of the transformer T, and is comprised of a P-type FET's m1 to m4, N-type FET's m5 to m7, and a constant current source m8. In the control circuit M, the FET's m1 and m2 and the constant current source m8 function as a current mirror circuit. Therefore, a value of current flowing from the constant current source m8 is equal to a value of current flowing to the FET m2. The FET's m5 and m6 constitute an active load on the FET's m3 and m4, which function as differential amplifier input elements. The FET m7 functions as an output circuit which draws in current depending on a gate voltage Vb thereof.

The control circuit M is connected via a resistance 51 to a junction A between resistances 52 and 53 and a capacitor C1. Voltage at the junction A is represented by Va. The capacitor C1 is a hold capacitor which forms a time constant circuit together with the resistances 52 and 53.

Reference numeral 60 designates an operational amplifier which has an output terminal and a negative input terminal, between which is connected a resistance 54 as a feedback resistance. The operational amplifier 60 has a positive input terminal connected to a junction R between resistances 55 and 56 serially connected between a power source and ground. Voltage at the junction R is represented by Vr, which is determined by a ratio in value between the resistances 55 and 56. A capacitor C2 is connected between the junction R and ground, to eliminate noise entering the junction R and hence stabilize the voltage Vr.

Reference numerals 70 and 71 designate comparators which each have a negative input terminal supplied with the voltage Vr. The comparators 70 and 71 have positive input terminals supplied with the input signal Vin via the output terminals t3 and t4, respectively. The comparators 70 and 71 each compare the input signal Vin with the voltage Vr as a threshold value. Output voltages from the comparators 70 and 71 are inverted by inverters 72 and 73, respectively, and then supplied to a circuit at a subsequent stage, not shown, as output voltages V(−) and V(+), respectively.

Next, the operation of the information-discriminating circuit according to the present embodiment constructed as above will be described with reference to FIGS. 5A to 5D and 6A to 6D.

First, description will be made of a case where the input signal Vin is so small in amplitude that voltage Vin(−) between the terminals t4 and t5 is always higher than the voltage Va at the junction A. The relationship in timing between the input signal Vin and the output voltages V(+) and V(−) is shown in FIGS. 5A to 5D, in which FIG. 5A shows a waveform of voltage Vin(+) between the terminals t3 and t5, FIG. 5B a waveform of the voltage Vin(−), FIG. 5C a waveform of the output voltage V(+), and FIG. 5D a waveform of the output voltage V(−), respectively.

In the illustrated example, the voltage Vin(−) is always higher than the voltage Va, and therefore the gate voltage Vb of the FET m7 is low, whereby the FET m7 is in an off-state. Accordingly, the control circuit M is in a high impedance state on the output side thereof, and therefore does not influence the voltage Va.

An imaginary short-circuit is formed between the positive input terminal and the negative input terminal of the operational amplifier 60 so that voltage at the negative input terminal is equal to the voltage Vr which is stable, as mentioned above. Accordingly, the voltage Va at the junction A is determined by a ratio in value between the resistances 52 and 53, and output voltage Vc from the operational amplifier 60 is determined by a ratio in value between the resistances 54, 53 and 52.

Thus, when Vin(−)>Va holds, the voltages Va and Vc assume fixed values, and the voltages Vin(+) and Vin(−) fluctuate with respect to the voltage Vc as a central value, as shown in FIGS. 5A and 5B. The fluctuating voltages Vin(+) and Vin(−) are supplied to the comparators 70 and 71 and compared with the voltage Vr as the threshold value, whereby the output voltages V(+) and V(−) as shown in FIGS. 5C and 5D are generated.

Next, description will be made of a case where the input signal Vin is so large in amplitude that a lower peak value of the voltage Vin(−) falls below the voltage Va. The relationship in timing between the input signal Vin and the output voltages V(+) and V(−) is shown in FIGS. 6A to 6D, in which FIG. 6A shows a waveform of the voltage Vin(+), FIG. 6B a waveform of the voltage Vin(−), FIG. 6C a waveform of the output voltage V(+), and FIG. 6D a waveform of the output voltage V(−), respectively.

When the input signal Vin with large amplitude as mentioned above is input, the input voltage Vin(−) falls below the voltage Va during time periods X1, X3, and X5 in FIG. 6B. First, during the time period X1, since the voltages Vin(−) and Va function as gate voltages of the FET's m3 and m4, respectively, the gate voltage Vb of the FET m7 rises so that the FET m7 turns on. The FET m7 draws in current via the resistance 51, whereby the voltage Va declines from a value Va1 to a value Va2, as shown in FIG. 6B. Since the voltage Vr is constant, the output voltage Vc from the operational amplifier 60 rises as the voltage Va declines. Since the output voltage Vc functions as a bias voltage superposed on the voltages Vin(+) and Vin(−), the voltages Vin(+) and Vin(−) rise as the voltage Vc rises, as shown in FIG. 6B.

Next, during the time period X2, similarly to the aforedescribed case where Vin(−)>Va always holds, the voltage Vb falls to turn the FET m7 off, and therefore the control circuit M does not influence the voltage Va. On this occasion, the hold capacitor C1 is charged via the resistance 53 with a predetermined time constant. The predetermined time constant, which is determined by the values of the resistances 52 and 53 and the hold capacitor C1, is set to such a sufficiently long time period in the present embodiment that the voltage Va should remain unchanged over one cycle of the input signal Vin. Therefore, during the time period X2, the voltage Va maintains the value Va2.

During the following time periods X3, X4, X5, . . . , operations similar to the operations over the time periods X1 and X2 described above are repeatedly carried out. As a result, the voltage Va progressively falls and the voltage Vc progressively rises. When the voltage Va becomes equal to the lower peak value of the voltage Vin(−), the fall of the voltage Va and the rise of the voltage Vc terminate. In this manner, the difference between the voltage Vr and the lower peak voltage of the voltage Vc becomes larger and the difference between the voltage Vr and the voltage Vin(−) (voltage Va) becomes larger, to thereby increase the noise margin.

The noise margin becomes the maximum value when the voltage Vr assumes a middle value between the voltage Va and the voltage Vc. The values of the resistances 52, 53, and 54 are determined so as to satisfy this value of the voltage Vr. Provided that the values of the resistances 52, 53, and 54 are represented by R2, R3, and R4, respectively, the following equations (1) to (3) are satisfied:

$$Vc-Vr=Vr-Va \qquad (1)$$

$$Va=Vr \cdot R2/(R2+R3) \qquad (2)$$

$$Vr=Vc \cdot (R2+R3)/(R2+R3+R4) \qquad (3)$$

If the equations (2) and (3) are substituted into the equation (1), the equation (1) can be reduced into an equation of R3=R4. In the present embodiment, therefore, to ensure the maximum noise margin, the same value is selected as the values of the resistances 53 and 54.

As described above, according to the present embodiment, the voltage Vc to be superposed on the input signal Vin is continuously variable according to the input level, and therefore the voltage Vc (bias voltage) can be adjusted relative to the voltage Vr (threshold value), in response to the input level, to thereby increase the noise margin. Especially, if the voltage Vr is set to a middle value between the voltage Va and the voltage Vc by setting the values of the resistances 53 and 54 to the same value, the noise margin can be maximized, to thereby minimize the bit error rate.

Further, the control circuit M functions to draw in current via the resistance 51 when the voltage Vin(−) falls below the voltage Va, i.e. upon rise of the lower peak level, whereas it does not output current when the voltage Vin(−) exceeds the voltage Va, i.e. upon fall of the lower peak level, which results in that the time constant changes between the rise of the lower peak level and the fall of the same. In the present embodiment, the time constant upon fall of the lower peak level is set to a sufficiently large value, and therefore the peak level can be held in the hold capacitor C1 over a time period from one peak to the next peak. As a result, the voltages Va and Vc can be adjusted relative to each other according to the input level, with a simple arrangement of the circuit.

Further, since the hold capacitor C1 is connected to the junction A between the resistances 53 and 52 which function as dividing resistances to determine the voltage Vr, the voltage Vc can be made constant when the voltage Vin(−) has such a small amplitude value that Vin(−)>Va holds. That is, the voltage Vc is made variable only when the amplitude of the input signal Vin exceeds a certain value. By virtue of this, the voltage Vc can be prevented from fluctuating due to noise having small amplitude, to thereby detect information only from the effective input signal Vin.

The present invention is not limited to the above described embodiment, but various variations thereof can be possible, including the following ones, for instance:

1) Although in the above described embodiment, the control circuit M controls the voltage Va, based on the voltage Vin(−), it is needless to say that the control circuit M may control the voltage Va, based on the voltage Vin(+) between the output terminals t3 and t5, in place of the voltage Vin(−), since the waveform of the voltage Vin(−) is inverted relative to the Vin(+) value.

2) Although in the above described embodiment, the voltage Vc is varied in order to adjust the relationship between the voltage Vc (bias voltage) and the voltage Vr (threshold value) according to the input level, the present invention is not limitative to the embodiment. Alternatively, the threshold values of the comparators 70 and 71 may be continuously varied according to the bias voltage Vc and the input level in place of or together with varying the voltage Vc.

As described above, according to the information-discriminating circuit of the present invention, the relationship between the bias voltage and the threshold value is varied according to the input level. As a result, the noise margin can be increased with a single construction.

What is claimed is:

1. An information-discriminating circuit comprising:
   a biasing device that superposes a bias voltage on an input signal;
   a comparator that discriminates information by comparing said input signal with said bias voltage superposed thereon with a threshold value, to generate an output signal indicative of the discriminated information; and
   a controller connected to said biasing device and said comparator, said controller adapted to continuously adjust a difference between said bias voltage and said threshold value such that a noise margin is varied according to amplitude of said input signal.

2. An information-discriminating circuit as claimed in claim 1, wherein said threshold value is a fixed value, and said controller continuously varies said bias voltage, based on said threshold value and said amplitude of said input signal, to thereby continuously adjust said difference between said bias voltage and said threshold value.

3. An information-discrimination circuit as claimed in claim 2, wherein said controller comprises a peak-hold circuit that detects a peak level of said input signal and holds said peak level with a shorter time constant upon rise of said peak level and with a longer time constant upon fall of said peak level, and a control circuit that continuously varies said bias voltage according to a difference between said peak level held by said peak-hold circuit and said threshold value.

4. An information-discriminating circuit as claimed in claim 3, wherein said peak-hold circuit holds said peak level of said input signal when said peak level exceeds a predetermined value.

5. An information-discriminating circuit as claimed in claim 4, wherein said threshold value is set to a middle value between said bias voltage and said peak level held by said peak-hold circuit.

6. An information-discriminating circuit as claimed in claim 1, wherein said controller continuously adjusts said difference between said bias voltage and said threshold value by controlling said bias voltage to a constant value when said amplitude of said input signal is smaller than a predetermined value, and increasing said bias voltage such that said noise margin becomes larger when said amplitude of said input signal is larger than said predetermined value.

7. An information-discriminating circuit for discriminating information from an input signal in a form of a ternary signal, comprising:
   an input transformer having a primary side thereof supplied with said input signal, and a secondary side thereof having a pair of output terminals and an intermediate terminal;
   a biasing device that supplies bias voltage to said intermediate terminal of said input transformer;
   a first comparator circuit that discriminates said information by comparing a first output signal from one of said output terminals of said input transformer with a threshold value, to generate an output signal indicative of the discriminated information;
   a second comparator circuit that discriminates said information by comparing a second output signal from another one of said output terminals of said input transformer with said threshold value, said second output signal being inverted relative to said first output signal, to generate an output signal indicative of the discriminated information;
   a peak-hold circuit that detects a peak level of one of said first and second output signals and holds said peak level with a shorter time constant upon rise of said peak level and with a longer time constant upon fall of said peak level; and
   a control circuit that controls said bias voltage according to a difference between said peak level held by said peak-hold circuit and said threshold value.

* * * * *